(12) United States Patent
Lee et al.

(10) Patent No.: US 7,226,860 B2
(45) Date of Patent: Jun. 5, 2007

(54) METHOD AND APPARATUS FOR FABRICATING METAL LAYER

(75) Inventors: Hsien-Ming Lee, Changhua (TW); Jing-Cheng Lin, Hsinchu (TW); Shing-Chyang Pan, Tainan (TW); Ming-Hsing Tsai, Taipei (TW); Hung-Wen Su, Hsinchu (TW); Shih-Wei Chou, Taipei (TW); Shau-Lin Shue, Hsinchu (TW); Kuo-Wei Cheng, Tainan (TW); Ting-Chu Ko, Taipei (TW)

(73) Assignee: Taiwan Semiconductor Manfacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 10/833,154

(22) Filed: Apr. 28, 2004

(65) Prior Publication Data

US 2005/0245072 A1 Nov. 3, 2005

(51) Int. Cl.
*H01L 21/44* (2006.01)
(52) U.S. Cl. ............... 438/678; 438/677; 205/205; 205/295; 257/E21.586
(58) Field of Classification Search ............ 438/676, 438/678, 408, 687, 906, FOR. 405, 677, 438/FOR. 107, FOR. 390; 257/E21.586; 205/205, 295
See application file for complete search history.

(56) References Cited

U.S. PATENT DOCUMENTS

| | | | |
|---|---|---|---|
| 5,950,071 A * | 9/1999 | Hammond et al. | 438/115 |
| 6,117,299 A | 9/2000 | Rinne et al. | |
| 6,258,220 B1 | 7/2001 | Dordi et al. | 204/198 |
| 6,395,642 B1 | 5/2002 | Liu et al. | 438/720 |
| 6,399,479 B1 | 6/2002 | Chen et al. | 438/628 |
| 6,399,486 B1 | 6/2002 | Chen et al. | 438/660 |
| 6,426,283 B1 | 7/2002 | Chen et al. | |
| 6,436,816 B1 | 8/2002 | Lee et al. | |
| 6,582,578 B1 | 6/2003 | Dordi et al. | 205/50 |
| 6,620,251 B2 | 9/2003 | Kitano | |
| 6,699,373 B2 | 3/2004 | Woodruff et al. | |
| 2004/0104120 A1 * | 6/2004 | Wang et al. | 205/137 |
| 2005/0064703 A1 * | 3/2005 | Kondo et al. | 438/633 |
| 2005/0206796 A1 * | 9/2005 | Okabe | 349/43 |

FOREIGN PATENT DOCUMENTS

| | | |
|---|---|---|
| JP | 03-052808 | 3/1991 |
| JP | 07-233499 | 9/1995 |
| JP | 2003-221696 | 8/2003 |
| TW | 475224 | 2/2002 |
| TW | 478107 | 3/2002 |
| TW | 573311 | 1/2004 |

* cited by examiner

*Primary Examiner*—Matthew Smith
*Assistant Examiner*—Julio J. Maldonado
(74) *Attorney, Agent, or Firm*—Birch, Stewart, Kolasch & Birch, LLP (57) ABSTRACT

A method of electrochemical deposition (ECD) provides a barrier and a seed layer on a substrate. The surfaces of the substrate are pre-treated before a metal layer is electrochemically deposited thereon in an electrochemical plating cell with a physical or a chemical surface treatment process. The electrochemical plating cell is covered by a cap to prevent evaporation of the electrolyte solution. The electrochemical plating cell includes a substrate holder assembly with a lift seal, e.g., with a contact angle θ less than 90° between the lift seal and the substrate. The substrate holder assembly includes a substrate chuck at the rear side of the substrate.

45 Claims, 10 Drawing Sheets
(1 of 10 Drawing Sheet(s) Filed in Color)

METHOD AND APPARATUS FOR FABRICATING METAL LAYER

BACKGROUND OF THE INVENTION

1. Field of the Invention

The present invention relates to a method and apparatus for fabricating a metal layer on a substrate, and more particularly, to a method and apparatus for fabricating a metal layer on a substrate using electrochemical deposition (ECD)

2. Description of the Related Art

Conductive interconnections on integrated circuits typically take the form of trenches and vias in the background art. In modern deep submicron integrated circuits, the trenches and vias are typically formed by a damascene or dual damascene process. Copper is currently used in ultra large scale integration (ULSI) metallization as a replacement for aluminum due to its lower resistivity and better electromigration resistance. Electrochemical copper deposition (ECD) has been adopted as the standard damascene or dual damascene process because of larger grain size (good electromigration) and higher deposition rates. More particularly, electroplating is well suited for the formation of small embedded damascene feature metallization due to its ability to readily control growth of the electroplated film for bottom-up filling, and the superior electrical conductivity characteristics of the electroplated film.

FIGS. 1A–1D illustrate a typical metallization technique for forming interconnect features in a multi-layered substrate of the background art. Generally, the method includes physical vapor deposition of a barrier layer over the feature surfaces, physical vapor deposition of a conductive metal seed layer, preferably copper, over the barrier layer, and electroplating of a conductive metal, preferably copper, over the seed layer to fill the interconnect structure/feature. The deposited layers and the dielectric layers are then planarized, such as by chemical mechanical polishing (CMP), to define a conductive interconnect feature.

Figure 1A:
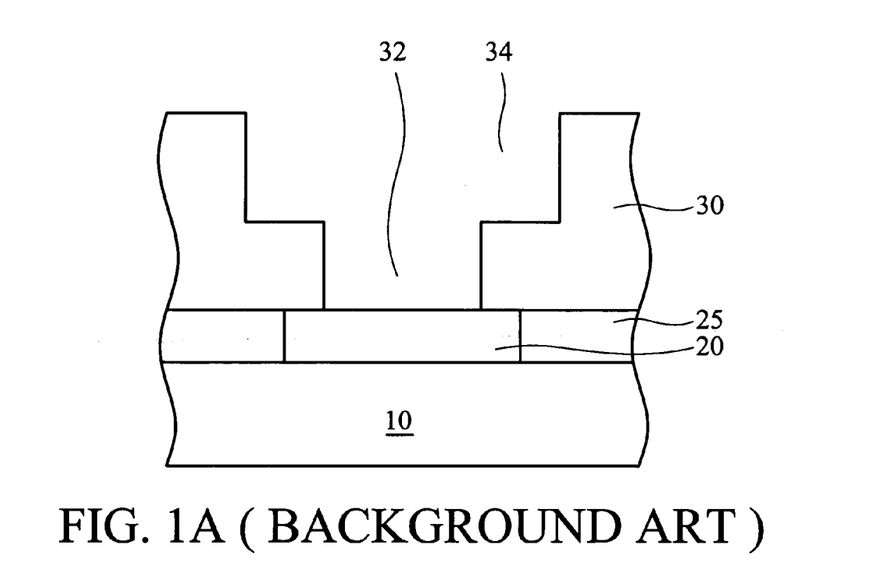
FIGS. 1A–1D are partial side views of a semiconductor substrate showing a typical metallization method in the background art for forming interconnect features.

In FIG. 1A, a semiconductor substrate 10 is provided. A copper metal interconnect 20 is shown patterned within an insulating layer 25, i.e., silicon oxide. In addition, a dielectric layer 30 is deposited and patterned with a via portion 32 and a trench portion 34. The dual damascene structure is thus formed including a via portion 32 and a trench portion 34. Although a dual damascene structure is illustrated in FIGS. 1A–1D, other types of interconnect features are also typically metallized using this technique.

Figure 1B:
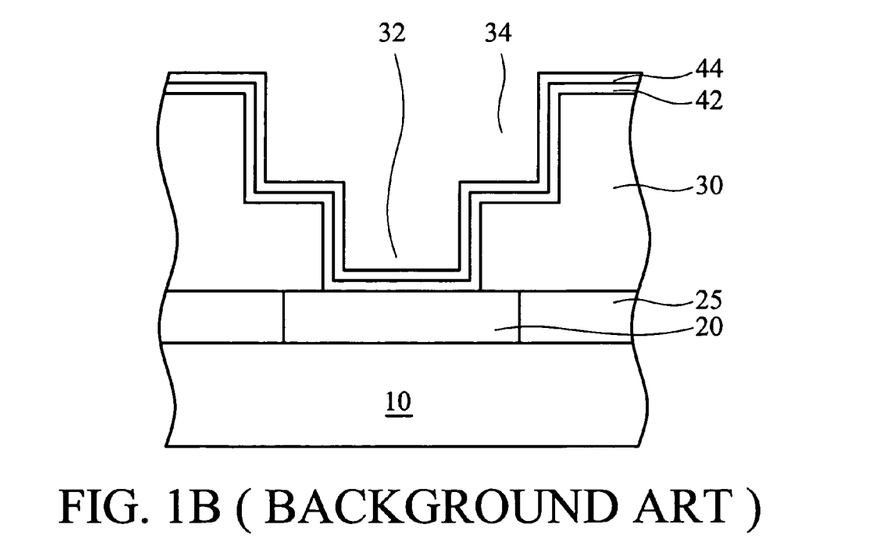

In FIG. 1B, a barrier layer 42, preferably including tantalum (Ta) or tantalum nitride (TaN), is deposited over the surface of the dielectric 30, including the surfaces of the via portion 32 and the trench portion 34. A copper seed layer 44 is deposited over the barrier layer 34 using physical vapor deposition (PVD). The copper seed layer 44 provides good adhesion for a subsequently electroplated copper layer.

Figure 1C:
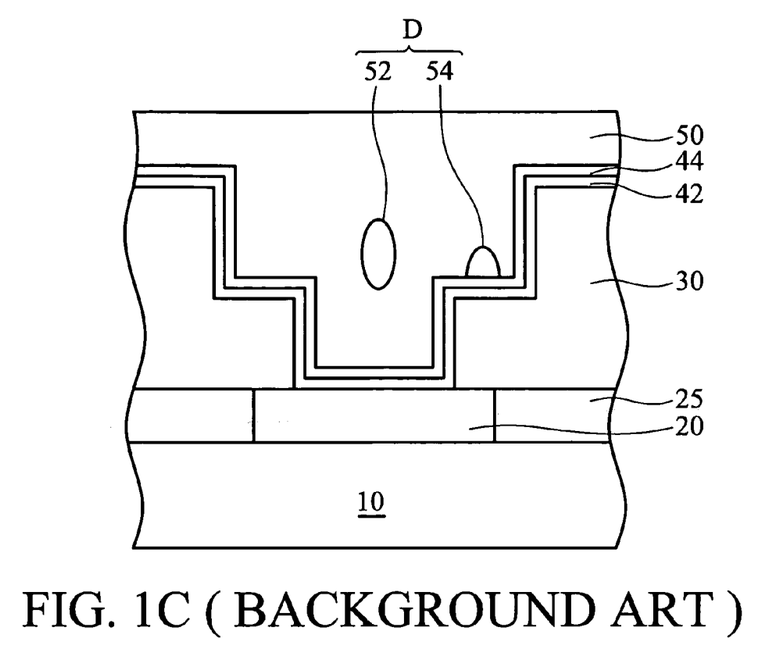

In FIG. 1C, a copper layer 50 is electroplated over the copper seed layer 44 to metallize the dual damascene structure. However, the electroplating metallization process presently practiced may yield voids 52 and 54, some of which can even reach the barrier/seed layer, possibly leading to defective or prematurely exhausted devices.

Figure 1D:
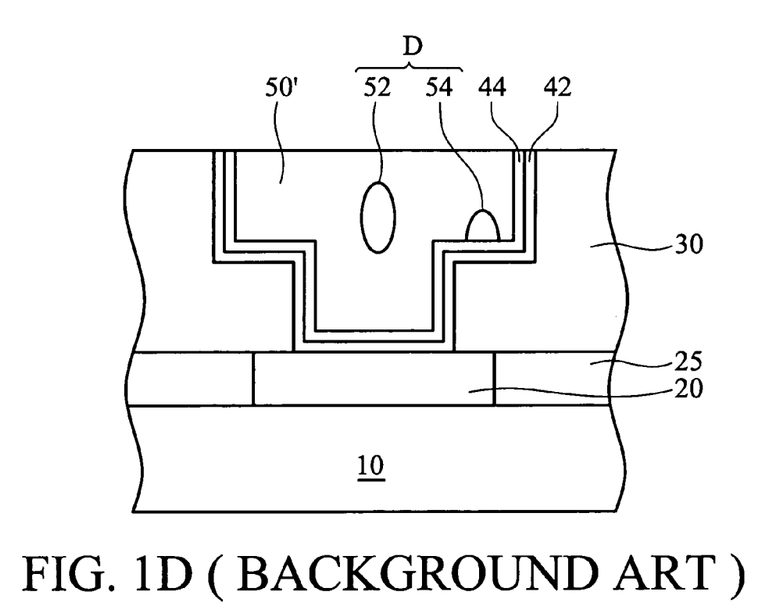

In FIG. 1D, the top portion of the processed substrate, i.e., the exposed electroplated copper layer 50 (shown in FIG. 1C), is then planarized, preferably by chemical mechanical polishing (CMP). During planarization, portions of the copper layer 50, copper seed layer 44, barrier layer 42, and a top surface of the dielectric layer 30 are removed from the top surface of the substrate, leaving a fully planar surface with conductive interconnect features, such as the dual damascene structure.

Figure 2:
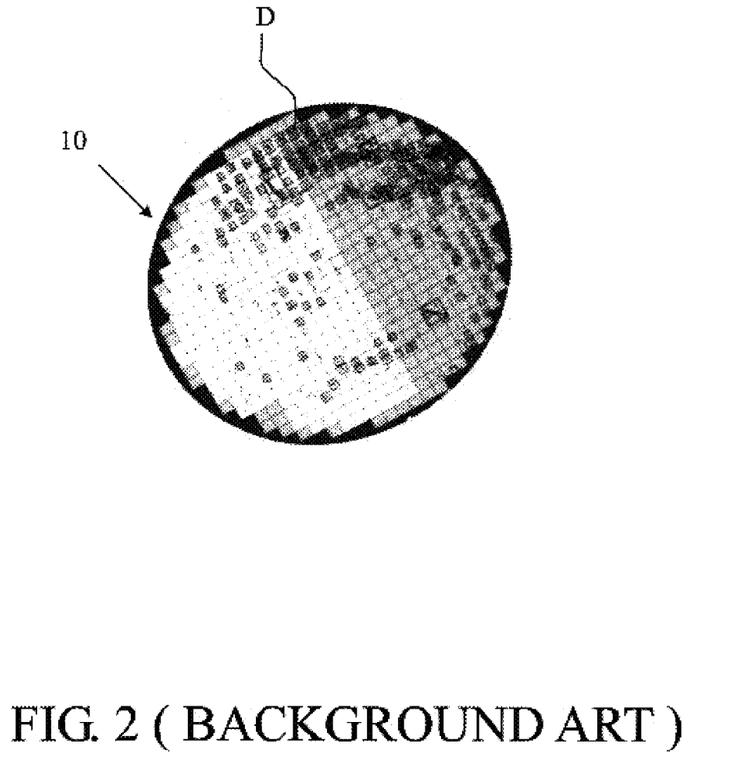
FIG. 2 is a perspective view of swirling defects on a silicon wafer formed due to surface contamination.

However, the present inventors have determined that there are problems relating to the quality of the deposited metal film. One challenge facing damascene and dual damascene processing is the formation of defects, such as pits, voids and swirling defects. A number of obstacles impair defect-free electrochemical deposition of copper onto substrates having submicron, high aspect features. Therefore, it is important that the electroplating surface is uniform and reliable to ensure defect-free deposition. As seen in FIG. 2, some processed wafers 10, experience swirling defects D after electrical plating due to surface contamination. Even after preventive maintenance, the defect problem still occurs which can negatively impact yield rate.

U.S. Pat. No. 6,395,642 (Liu et. al.), the entirety of which is hereby incorporated by reference, describes an integrated process of plasma cleaning of the structure prior to the electroplating of copper. $NH_3$ plasma or, $H_2/N_2$ thermal reduction can be employed. The integrated process promotes controlled electrochemical deposition (ECD) of copper for solid filling of the trench.

In addition, the electrochemical copper deposition (ECD) process is a wet process. Poor wettability between wafer plating surfaces and the electrolyte causes voids in the trenches and vias, as copper is electroplated and grows from all sides onto the seed layer. Another difficulty inherent in immersion of the wafer in a plating solution is air bubbles occurring on the wafer surface, which may disrupt the flow of electrolytes and electrical current to the wafer plating surface impacting uniformity and function of the deposited layer. A conventional method of reducing air bubble function immerses the wafer vertically into the plating solution. However, mounting the wafer vertically for immersion into the plating solution adds complexity and hinders automation of the electroplating process. Accordingly, it is desirable to have an apparatus for electroplating a wafer that avoids air bubble occurrence.

U.S. Pat. No. 6,582,578 (Dordi et. al.), the entirety of which is hereby incorporated by reference, describes an electrochemical plating (ECP) system that limits the formation of air bubbles between the substrate and/or the substrate holder assembly during immersion of the substrate into the electrolyte solution. A substrate is immersed in the electrochemical plating system tilting the substrate at immersion reducing trapping or formation of air bubbles between the substrate and the substrate holder assembly. However, even using the cited method, it is difficult to eliminate all microbubbles. The electrolyte may also evaporate during ECP, and the vapor can easily condense on other unprocessed wafers. These deleterious effects with electrochemical copper deposition usually cause reliability problems, such that it is important to prevent contamination of the electroplating surface from the electrolyte.

Another conventional method to solve on or more of the aforementioned problems is to anneal the copper film under atmospheric pressure or less. U.S. Pat. No. 6,399,486 (Chen et. al.), the entirety of which is hereby incorporated by reference, describes a special annealing process to remedy electrochemical copper deposited (ECD) defects in a dual damascene via and trench structure. The annealing conditions utilize special annealing steps to promote low temperature copper surface diffusion to remedy the voids and other defects within the copper trench and via structure. Annealing takes place at approximately 300 to 500° C., under nitrogen $N_2$, hydrogen $H_2$ gases (reducing atmosphere to remove copper oxide, $N_2/H_2$ plasma preferred), approximately 100 MPa to 600 MPa, for approximately 0.5 to 10 minutes. These conditions take advantage of low temperature surface diffusion mechanisms. However, voids are not completely eliminated during these conventional annealing processes.

SUMMARY OF THE INVENTION

The present invention overcomes the shortcomings associated with the background art and achieves other advantages not realized by the background art.

An object of the present invention is to provide a defect-free metal layer utilizing electrochemical deposition (ECD).

Another object of the present invention is to provide a method of removing the surface contamination before starting electroplating.

Another object of the present invention is to provide a method of improving wettibility between a wafer plating surface and the electrolyte.

Another object of the present invention is to provide a method inhibiting the formation of air bubbles on the electroplating surface during electroplating.

Another object of the present invention is to provide a method preventing electrolyte vapor condensation on unprocessed wafers.

One or more of these and other objects are accomplished by a method of electrochemical deposition comprising providing a substrate; and electrochemically depositing metal on the substrate in an electrochemical plating cell, wherein the electrochemical plating cell is covered by a cap.

One or more of these and other objects are accomplished by a method of electrochemical deposition comprising providing a substrate; forming a barrier layer and a seed layer on the substrate; and electrochemically depositing metal on the substrate in an electrochemical plating cell, wherein the electrochemical plating cell is covered by a cap and the electrochemical plating cell includes a substrate holder assembly with a lift seal, the substrate holder assembly further including a contact angle $\theta$ less than 90° between the lift seal and the substrate, and a substrate chuck on a rear side of the substrate.

One or more of these and other objects are accomplished by a method of electrochemical deposition comprising providing a substrate having a plurality of surfaces; forming a barrier layer and a seed layer on the substrate; illuminating the surfaces of the substrate with an UV/DUV illumination process; and electrochemically depositing a metal on the substrate in an electrochemical plating cell, wherein the electrochemical plating cell is covered by a cap.

One or more of these and other objects are accomplished by a method of electrochemical deposition comprising providing a substrate with a plurality of surfaces; forming a barrier layer and a seed layer on the substrate; esterifying the surfaces of the substrate; and electrochemically depositing a metal on the substrate in an electrochemical plating cell, wherein the electrochemical plating cell is covered by a cap.

One or more of these and other objects are accomplished by a method of electrochemical deposition comprising providing a substrate having a plurality of surfaces; forming a barrier layer and a seed layer on the substrate; rinsing the surfaces of the substrate with a wetting-agent; and electrochemically depositing a metal on the substrate in an electrochemical plating cell, wherein the electrochemical plating cell is covered by a cap.

One or more of these and other objects are accomplished by a method of electrochemical deposition comprising providing a substrate having a plurality of surfaces; forming a barrier layer and a seed layer on the substrate; removing contaminants from a surface of the substrate with a physical or a chemical surface treatment process; and electrochemically depositing a metal on the substrate in an electrochemical plating cell, wherein the electrochemical plating cell is covered by a cap.

One or more of these and other objects are accomplished by an apparatus for electrochemical deposition comprising an electrochemical cell for electrochemically depositing a metal on a substrate, wherein the electrochemical cell further includes a electrolyte bath; an anode; a substrate holder assembly including a substrate chuck, a cathode contact ring and a lift seal; and a cap covering the electrochemical deposition cell.

The invention improves on conventional methods in that the electroplating surfaces of the structure with a barrier layer and a seed layer are pre-treated using physical or electrochemical methods. Since surface contamination is removed before electroplating, a defect-free metal layer is formed on the substrate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention will become more fully understood from the detailed description given hereinafter and the accompanying drawings which are given by way of illustration only, and thus are not limitative of the present invention, and wherein.

DETAILED DESCRIPTION OF THE INVENTION

Figure 3:
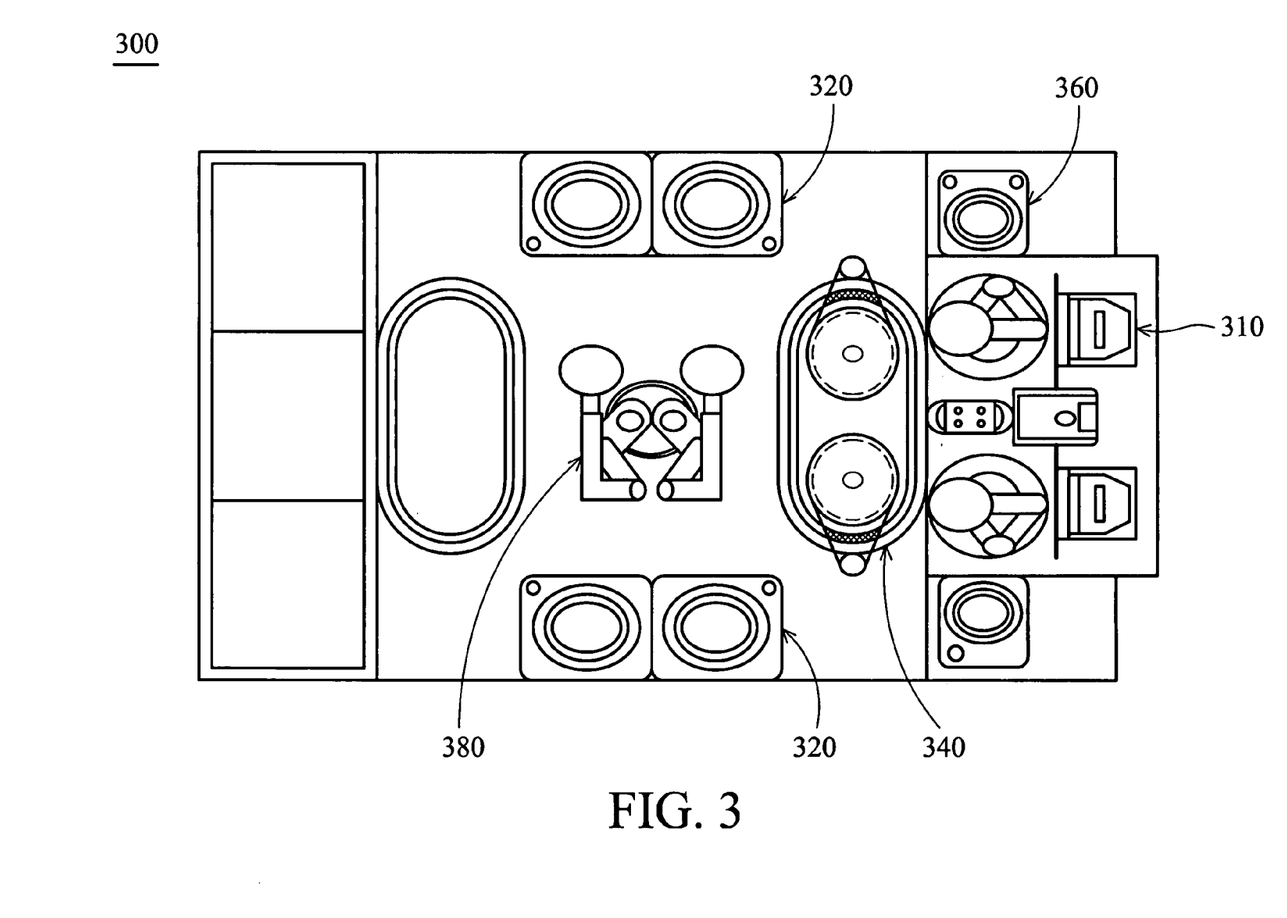
FIG. 3 is an upper plan view of the ECP system according to the present invention.
Figure 4:
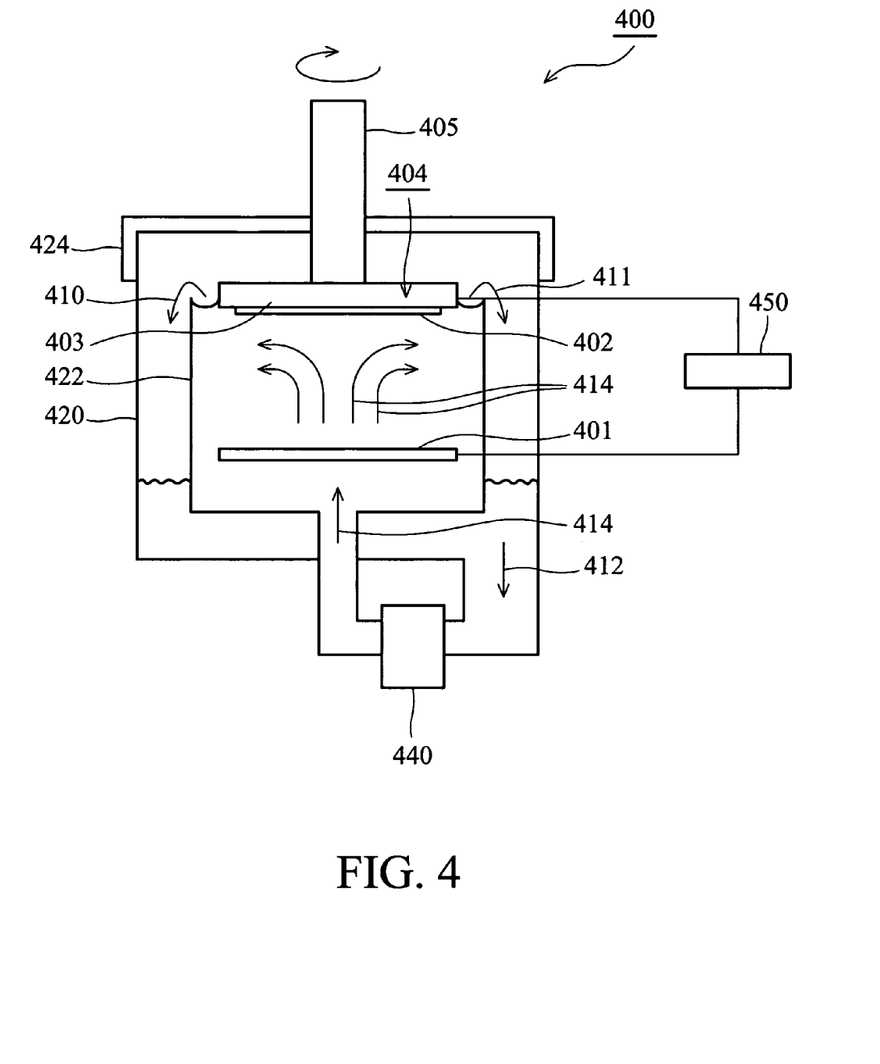
FIG. 4 is a schematic view of an electroplating apparatus according to the present invention.
Figure 5:
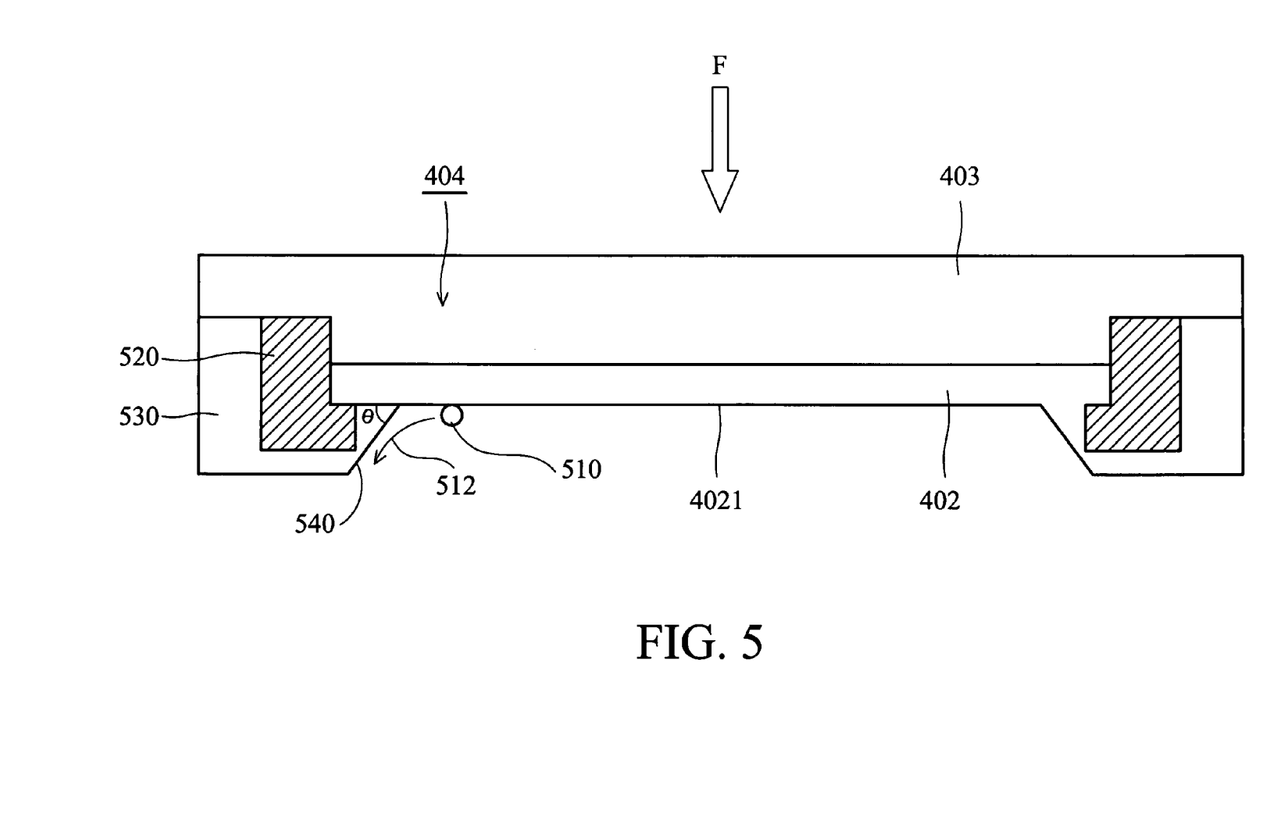
FIG. 5 is a sectional view of a substrate holder assembly according to an embodiment of the present invention.
Figure 6:
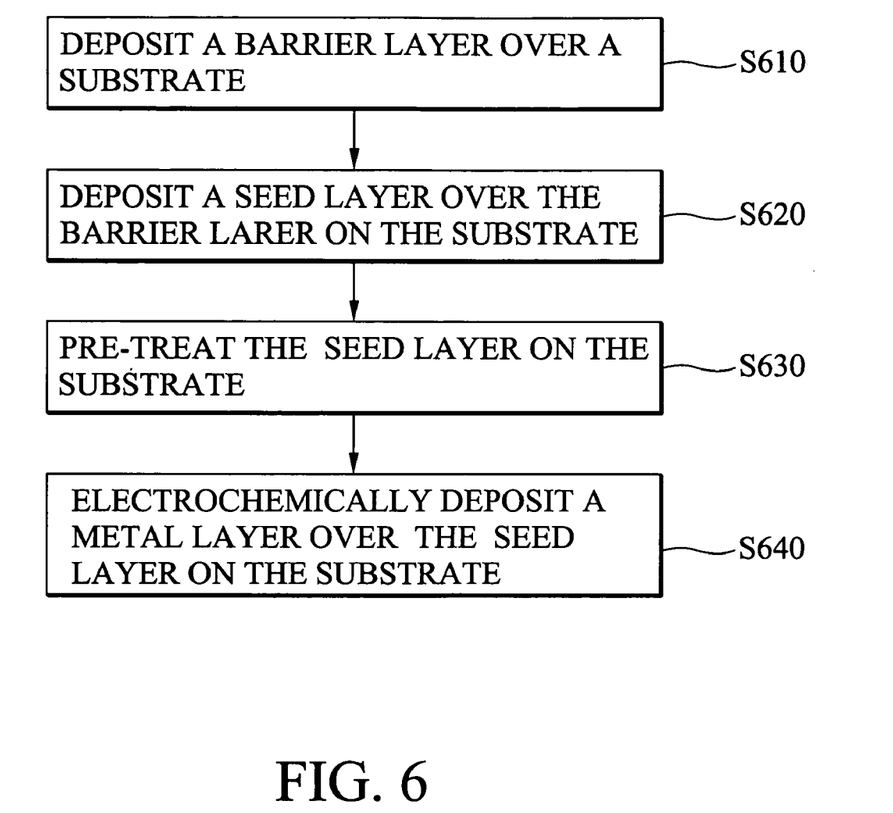
FIG. 6 is a flow chart of a metallization technique for filling an interconnect structure according to an embodiment of the present invention.

The present invention will hereinafter be described with reference to the accompanying drawings. FIG. 3 is an upper plan view of the ECP system according to the present invention. FIG. 4 is a schematic view of an electroplating apparatus according to the present invention. FIG. 5 is a sectional view of a substrate holder assembly according to an embodiment of the present invention. FIG. 6 is a flow chart of a metallization technique for filling an interconnect structure according to an embodiment of the present invention. FIGS. 7A–7E are cross sectional views of dual damascene interconnect lines during various stages of the fabrication process.

The present invention, which provides a method of fabricating a metal layer using electrochemical deposition (ECD), is described in greater detail by referring to the drawings that accompany the present invention. It is noted that in the accompanying drawings, like and/or corresponding elements are referred to by like reference numerals.

FIG. 3 is an upper plan view of an ECD system 300 according to the present invention. Referring to FIG. 3, the ECD system 300 generally includes a loadlock station 310, a rapid thermal annealing (RTA) chamber 360, spin-rinse-dry (SRD) and edge bevel removal (EBR) chambers 340, a dual blade robot 380, and one or more electrochemical plating process cells 320. An electrolyte solution system (not shown) is positioned adjacent the ECD system 300 and connected to the process cells 320 individually to circulate the electrolyte for electroplating. The ECD system 300 also includes a controller that typically includes a programmable microprocessor.

FIG. 4 is a schematic view of an electrochemical plating process apparatus 400, with a wafer 402 mounted on a substrate chuck 403 in accordance with one embodiment of the present invention. Apparatus 400 includes a substrate holder assembly 404 mounted on a rotatable spindle 405 which allows rotation thereof. Although the invention is described using a simplified electrochemical plating apparatus, other electrochemical plating apparatuses are equally suitable to achieve the desired processing results.

During electrochemical plating, wafer 402 is mounted in the substrate chuck 403 and substrate holder assembly 404, which is then placed in a plating bath 422 containing plating solution. As indicated by arrow 413, plating solution is continually applied by a pump 440. Generally, plating solution flows upwards to the center of wafer (anode) 401 and then radially outward and across the wafer 402 as indicated by arrows 414.

Plating solution then overflows from plating bath 422 to an overflow reservoir 420 as indicated by arrows 410 and 411. Plating solution is then filtered (not shown) and returned to pump 440 as indicated by arrow 412, completing recirculation.

Typical electroplating solution contains electrolyte, such as $CuSO_4$ and other additives, which may evaporate and condense on the electroplating surface of unprocessed wafers and damage surfaces of unprocessed wafers causing Cu losses and coin defects, e.g., likely due to spontaneous electrochemical etching. As a key feature of this embodiment, a cap 424 is provided covering the ECP processing cell to prevent electrolyte vapor condensation. Although the cap described in the present invention has been illustrated in FIG. 4, it is understood that many types and constructions of caps can be provided to prevent electrolyte vapor condensed on the seed layer surfaces. Preferably, the cap 424 is made of plastics, although other materials such as PP.PVC,PE are also viable.

A DC power supply 450 has a negative output lead electrically connected to wafer 402 through one or more slip rings, brushes, and contacts (not shown). The positive output lead of power supply 450 is electrically connected to an anode 401 located in the plating bath 422. During electroplating, power supply 450 biases the wafer 402 to provide a negative potential relative to the anode 401 causing electrical current to flow from the anode 401 to the wafer 402. (As used herein, electrical current flows in the same direction as the net positive ion flux and opposite to the net electron flux.) This causes an electrochemical reaction (e.g. $Cu^{2+}+2e^-=Cu$) on the wafer 402 which results in deposition of the electrically conductive layer (e.g. copper) on the wafer 402. The ion concentration of the plating solution is replenished during the plating cycle, for example by dissolution of a metallic anode (e.g. $Cu=Cu^{2+}+2e^-$).

FIG. 5 is a sectional view of a substrate holder assembly 404 according to the present invention. The substrate holder assembly 404 typically includes a substrate chuck 403, an electric contact ring 520, and a support ring 530, which extends around the periphery of the wafer 402. A dry contact ring must implant a support seal ring 530 to prevent electroplating bath from damaging the electric contact ring 520. The support ring 530 is critical in bubble trapping measures. Improper lift seal design can create difficulty in measuring trapped bubbles, leading to swirling defects. The invention limits the number of trapped bubbles that contact the seed layer during processing, providing a uniform electric current density across the seed layer on the substrate during plating. The contact angle θ between the support ring 530 and the wafer electroplating surface 4021 can be reduced. The present inventors have determined that an acute contact angle dramatically reduces the number of trapped bubbles 510 and increases flow rates, eliminating trapped bubbles during the ECD process, as indicated by arrows 512. Therefore, the contact angle θ is preferably less than approximately 90°.

The contact ring 530 physically supports the wafer 402 typically during electroplating. Portions of the substrate holder assembly 403, such as electric contact rings 520, together with the substrate (anode) 402, define a downward-facing concave surface. As the substrate holder assembly is immersed with the substrate, the concave surface defined by the substrate and substrate holder assembly 403 can trap air that forms air bubbles 510 within the plating solution.

Accordingly, substrate flatness plays an important role in alleviating bubble trapping, since substrates with concave profile tend to trap more bubbles during ECD process. Another embodiment of this invention limits the number of air bubbles or bridges that contact the seed layer during processing, providing a more uniform electric current density across the seed layer on the substrate during plating. Rear pressure F is exerted on the substrate to flatten the surface thereof, or preferably, enough force is applied to render, in fact, convex, providing even more dramatic reduction of trapped bubbles and increase flow rates during ECD process. In a preferred embodiment of the present invention, rear pressure F is applied at approximately 1 to 100 psi. More preferably, 10 psi rear pressure is exerted on an 8" wafer with four metal layers and 50% pattern density. By reducing the contact angle between the seal and the electroplating surface, any air bubbles entrapped on wafer 402 are quickly dispelled with further enhancement of air bubble removal by exertion of strong rear pressure F on the substrate.

FIG. 6 is a flow chart of a metallization technique filling an interconnect structure according to the present invention. First, a high conductance barrier layer is deposited (S610) over the surfaces of the substrate including those outlining the interconnect structure. The barrier material is deposited using one of the techniques according to the present invention. For a high conductance barrier layer including a high conductance material such as tungsten, tungsten nitride, titanium and titanium nitride, or combinations thereof, the barrier layer can be deposited by a variety of deposition methods, e.g., including PVD and CVD.

Second, a seed layer is deposited (S620) over barrier layer, preferably, using HDP-PVD to maximize seed layer deposition on the bottom portion of the interconnect features and minimize seed layer deposition on the sidewall portions of the interconnect feature. The copper seed layer is preferably deposited utilizing high density plasma physical vapor deposition (HDP-PVD). Alternatively, the seed layer can be formed by other deposition techniques, e.g., such as conventional PVD and CVD. Step S610 and step S620 together prepare a substrate plating surface for electroplating that fills interconnect features/structures.

Physical or chemical surface treatment processes can be employed (S630) on the seed layer of the substrate to remove natural oxides, defects, organic/inorganic foreign contaminants, and impurities from the metal surface of the plated body, to form a desired uniform plating layer with strong adhesiveness. UV/DUV exposure can be utilized with high energy and high frequency to eliminate the contaminants from the Cu seed layer. An electrochemical pretreatment may alternatively be used to remove Cu seed layer contamination, in which the surface is esterified using an alkaline solution. A wetting agent improves wetting conditions between the electroplating surface and electrolyte. Next, electroplating (S640) metallizes the structures on the substrate. Electroplating can be accomplished using a variety of electroplating apparatus and techniques.

FIGS. 7A–7E are typical metallization techniques forming interconnect features in a multi-layered substrate. Generally, the method includes physical vapor deposition of barrier layer over the feature surfaces, physical vapor deposition of a conductive metal seed layer, preferably copper, over the barrier layer, and then electroplating of a conductive metal, preferably copper, over seed layer filling interconnect structures/features. Finally, the deposited layers and the dielectric layers are planarized, such as by chemical mechanical polishing (CMP), to define a conductive interconnect feature.

Figure 7A:
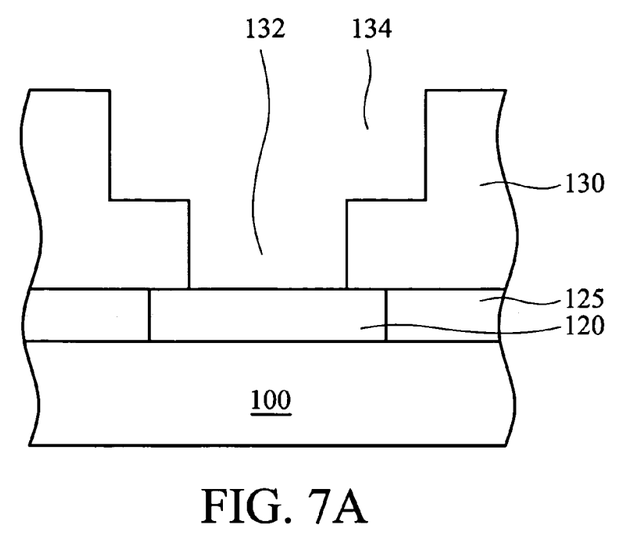
FIGS. 7A–7E are cross sectional views of dual damascene interconnect lines during various stages of the fabrication process.
Figure 7B:
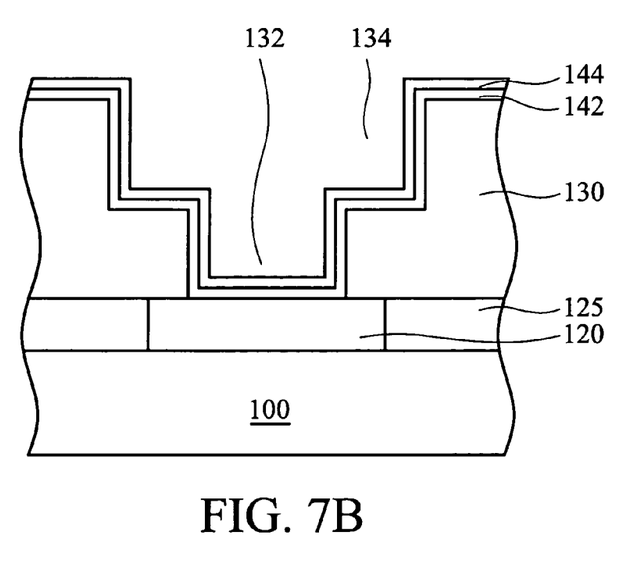
Figure 7C:
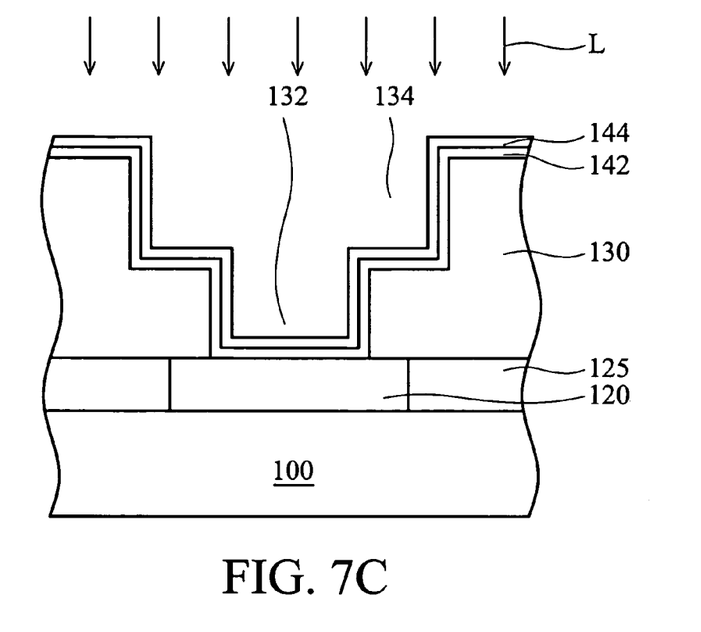

Referring to FIG. 7A, a semiconductor substrate 100 is provided. A copper metal interconnect 120 is shown patterned within an insulating layer 125, i.e. silicon oxide. In addition, a dielectric layer 130 is deposited and patterned with a via portion 132 and a trench portion 134. Referring to FIG. 7B, a barrier layer 142, preferably including tantalum (Ta) or tantalum nitride (TaN), is deposited over the surface of the dielectric 130, including the surfaces of the via portion 132 and the trench portion 134. The barrier layer 142 is typically deposited using physical vapor deposition (PVD) by sputtering or reactive PVD. The barrier layer 142 limits the diffusion of copper into the semiconductor substrate and the dielectric layer, thereby dramatically increasing reliability. For a high conductance barrier layer including tantalum, the barrier layer is preferably deposited at low temperature (<350° C.) PVD and then annealed at between approximately 350° C. to 600° C., or deposited by PVD at between approximately 350° C. to 600° C. Preferably, a barrier layer has a film thickness between approximately 250 and 500 Å for interconnect structures/features having sub-micron opening width. It is preferred that the barrier layer has a thickness between approximately 50 and 300 Å.

A copper seed layer 144 is deposited over the barrier layer 34 using PVD. The copper seed layer 144 provides good adhesion for subsequent electroplating of copper. It is preferred that the seed layer have a thickness between approximately 500 and 2000 Å.

After barrier/seed process and during return to a loadlock, the electroplating surface may be contaminated by lubricant vapor on Cu seed layer. To eliminate the contaminants on the Cu seed layer, the contaminated Cu seed layer can be physically exposed to UV/DUV illuminant with high energy and high frequency. The UV/DUV illumination process can include laser illumination, continuous or pulsed. The UV/DUV illuminant preferably includes a halogen light source with wavelength less than 380 nm, more preferably a pulsed excimer laser with a wavelength below 248 nm. The mechanism removing contaminants from Cu seed layer includes bond-breaking, photo-ablation, photo-thermal decomposition or photo-thermal decomposition.

Alternatively, an electrochemical method may be used to remove Cu seed layer contamination, including esterification using an alkaline solution with pH value of the alkaline solution exceeding 10, such as NaOH or KOH. The esterification by-products are water soluble. A fresh electroplating surface is thus achieved after DI water rinsing and removal of the esterification by-products.

Since wettibility of the ECD solution used for immersion can be influenced by the condition of the Cu seed layer surface, surface oxidation, organic contamination or undue texture can cause pits or pinhole defects due to de-wetting spots. The electroplating surface is rinsed with an organic wetting agent, such as organic acid, citric acid or acetic acid, and ionic polymer, such as polyethylene glycol, amine terminated polyethylene glycol, polyalkylene glycol, or polyethylene glycol ester, to maximize wetting.

Figure 7D:
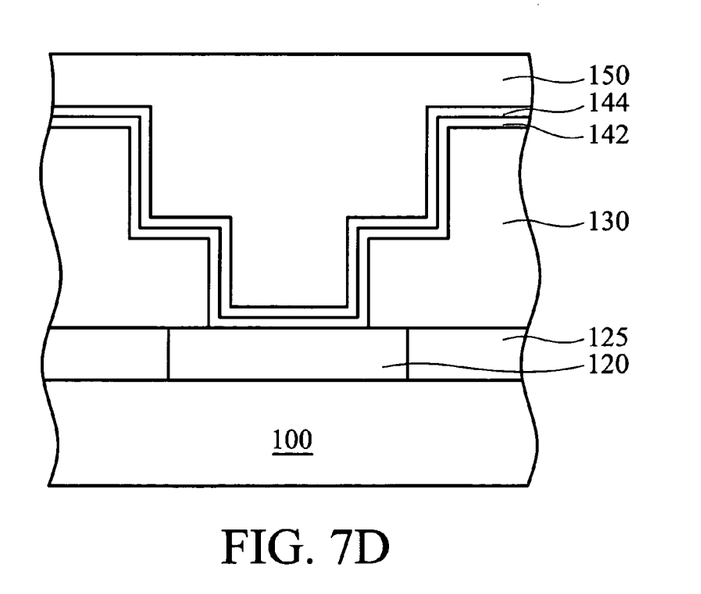
Figure 7E:
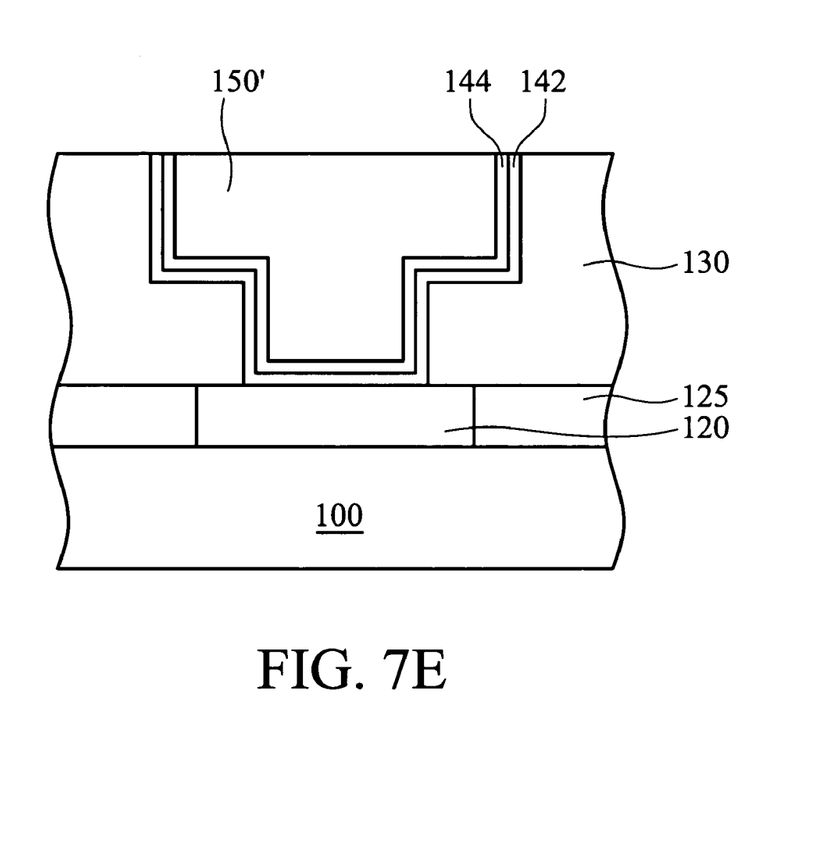

Referring to FIG. 7D, a copper layer 150 is electroplated over the copper seed layer 144 to metallize the dual damascene structure. Referring to FIG. 7E, the top portion of the processed substrate, i.e., the exposed electroplated copper layer 150 (shown in FIG. 7D), is then planarized, preferably by chemical mechanical polishing (CMP). During the planarization process, portions of the copper layer 150, copper seed layer 144, barrier layer 142, and a top surface of the dielectric layer 130 are removed from the top surface of the substrate, leaving a fully planar surface with conductive interconnect features, such as a dual damascene structure.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of electrochemical deposition comprising:
   providing a substrate;
   treating a surface of the substrate before a metal layer is deposited;
   electrochemically depositing the metal layer on the substrate in an electrochemical plating cell, wherein the electrochemical plating cell is covered by a cap, wherein the electrochemical plating cell includes a substrate chuck at a rear side of the substrate; and
   exerting a force on the rear side of the substrate to render the substrate convex toward the electrochemical plating cell, thereby reducing trapped bubbles and increase flow rates.

2. The method according to claim 1, wherein the metal is Cu.

3. The method according to claim 1, further comprising forming a barrier and a seed layer on the substrate.

4. The method according to claim 3, wherein the surface of the substrate is treated using an UV/DUV illumination process.

5. The method according to claim 4, wherein the UV/DUV illumination process includes a laser illumination process.

6. The method according to claim 5, wherein the laser illumination process includes a continuous laser illumination process or a pulsed laser illumination process.

7. The method according to claim 4, wherein the wavelength of the UV/DUV illumination process is less than approximately 380 nm.

8. The method according to claim 4, wherein the wavelength of the UV/DUV illumination process is less than approximately 248 nm.

9. The method according to claim 3, wherein the surface of the substrate is treated using esterification.

10. The method according to claim 9, wherein the surface of the substrate is esterified in alkaline solution.

11. The method according to claim 10, wherein the alkaline solution includes KOH or NaOH.

12. The method according to claim 9, further comprising an electrochemical procedure to remove the esterified material.

13. The method according to claim 3, wherein the surface of the substrate is treated using a wetting-agent.

14. The method according to claim 13, wherein the wetting-agent includes an organic acid or an ionic polymer.

15. The method according to claim 14, wherein the organic acid includes a citric acid or an acetic acid.

16. The method according to claim 14, wherein the ionic polymer includes polyethylene glycol, amine terminated polyethylene glycol, polyalkylene glycol, or polyethylene glycol ester.

17. The method according to claim 1, wherein the electrochemical plating cell includes a substrate holder assembly with a lift seal, wherein the substrate holder assembly includes a contact angle θ between the lift seal and the substrate and said contact angle θ is less than 90°.

18. The method according to claim 1, wherein the rear force is approximately 10 to 20 psi.

19. A method of electrochemical deposition comprising:
providing a substrate;
forming a barrier layer and a seed layer on the substrate;
treating a surface of the substrate before a metal layer is deposited; and
electrochemically depositing the metal layer on the substrate in an electrochemical plating cell, wherein the electrochemical plating cell is covered by a cap and the electrochemical plating cell includes a substrate holder assembly with a lift seal, the substrate holder assembly further including:
a contact angle θ less than 90° between the lift seal and the substrate, and
a substrate chuck on a rear side of the sub strate; and
exerting a force on a rear side of the substrate to render the substrate convex toward the electrochemical plating cell, thereby reducing trapped bubbles and increase flow rates.

20. The method according to claim 19, wherein the surface of the substrate is treated using a UV/DUV illumination process.

21. The method according to claim 20, wherein the UV/DUV illumination process includes a laser illumination process.

22. The method according to claim 21, wherein the laser illumination process includes continuous laser illumination or pulsed laser illumination.

23. The method according to claim 20, wherein the wavelength of the UV/DUV illumination process is less than approximately 380 nm.

24. The method according to claim 20, wherein the wavelength of the UV/DUV illumination process is less than approximately 248 nm.

25. The method according to claim 19, wherein the surface of the substrate is treated using esterification.

26. The method according to claim 25, wherein the surface of the substrate is esterified in an alkaline solution.

27. The method according to claim 26, wherein the alkaline solution includes KOH or NaOH.

28. The method according to claim 25, further comprising an electrochemical process to remove the esterified material.

29. The method according to claim 19, wherein the surface of the substrate is treated using a wetting-agent.

30. The method according to claim 29, wherein the wetting-agent includes an organic acid or an ionic polymer.

31. The method according to claim 30, wherein the organic acid includes a citric acid or an acetic acid.

32. The method according to claim 30, wherein the ionic polymer includes polyethylene glycol, amine terminated polyethylene glycol, polyalkylene glycol, or polyethylene glycol ester.

33. A method of electrochemical deposition comprising:
providing a substrate having a plurality of surfaces;
forming a barrier layer and a seed layer on the substrate;
illuminating the surfaces of the substrate with an UV/DUV illumination process before a metal layer is deposited;
electrochemically depositing the metal layer on the substrate in an electrochemical plating cell, wherein the electrochemical plating cell is covered by a cap, and wherein the electrochemical plating cell includes a substrate chuck at a rear side of the substrate; and
exerting a force on the rear side of the substrate to render the substrate convex toward the electrochemical plating cell, thereby reducing trapped bubbles and increase flow rates.

34. The method according to claim 33, wherein the UV/DUV illumination process includes a laser illumination process.

35. The method according to claim 34, wherein the laser illumination process includes continuous laser illumination or pulsed laser illumination.

36. The method according to claim 33, wherein the wavelength of the UV/DUV illumination process is less than approximately 380 nm.

37. The method according to claim 33, wherein the wavelength of the UV/DUV illumination process is less than approximately 248 nm.

38. The method according to claim 33, wherein the electrochemical plating cell includes a substrate holder assembly with a lift seal and the substrate holder assembly includes a contact angle θ between the lift seal and the substrate.

39. The method according to claim 38, wherein the contact angle θ is less than 90°.

40. The method according to claim 33, wherein the rear force is approximately 10 to 20 psi.

41. A method of electrochemical deposition comprising:
providing a substrate having a plurality of surfaces;
forming a barrier layer and a seed layer on the substrate;
removing contaminants from a surface of the substrate with a physical or a chemical surface treatment process before a metal layer is deposited;
electrochemically depositing a the metal layer on the substrate in an electrochemical plating cell, wherein the electrochemical plating cell is covered by a cap, and wherein the electrochemical plating cell includes a substrate chuck at a rear side of the substrate; and
exerting a force on the rear side of the substrate to render the substrate convex toward the electrochemical plating cell, thereby reducing trapped bubbles and increase flow rates.

42. The method according to claim 41, wherein the physical or the chemical surface treatment process includes illuminating the surface of the substrate with an UV/DUV illumination process.

43. The method according to claim 41, wherein the physical or the chemical surface treatment process includes esterifying the surface of the substrate.

44. The method according to claim 41, wherein the physical or the chemical surface treatment process includes rinsing the surface of the substrate with a wetting-agent.

45. The method according to claim 41, wherein the physical or the chemical surface treatment process includes at least one of the following processes: rinsing the surfaces of the substrate with a wetting-agent; esterifying the surface of the substrate; and illuminating the surface of the substrate with a UV/DUV illumination process.

* * * * *